US008796137B2

(12) United States Patent
Pagaila et al.

(10) Patent No.: US 8,796,137 B2

(45) Date of Patent: Aug. 5, 2014

(54) SEMICONDUCTOR DEVICE AND METHOD OF FORMING RDL ALONG SLOPED SIDE SURFACE OF SEMICONDUCTOR DIE FOR Z-DIRECTION INTERCONNECT

(75) Inventors: Reza A. Pagaila, Singapore (SG); Yaojian Lin, Singapore (SG); Jun Mo Koo, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 181 days.

(21) Appl. No.: 12/822,488

(22) Filed: Jun. 24, 2010

(65) Prior Publication Data

US 2011/0316156 A1 Dec. 29, 2011

(51) Int. Cl.
*H01L 21/44* (2006.01)

(52) U.S. Cl.
USPC ............................ 438/666; 438/107; 438/113

(58) Field of Classification Search
CPC .......................... H01L 23/5386; H01L 21/822
USPC .......... 257/618, 623–625, E23.001, E23.002, 257/E23.01–E23.079, E23.141–E23.178, 257/E21.506–E21.519, E21.575–E21.597, 257/734–786, E21.502, E23.175; 438/110, 438/113, 460, 462, 464, 584, 597–688, 106, 438/107
See application file for complete search history.

(56) References Cited

U.S. PATENT DOCUMENTS 6,433,367 B1 * 8/2002 Tohyama et al. ............... 257/88
6,501,663 B1 * 12/2002 Pan .............................. 361/779
7,192,796 B2 3/2007 Zilber et al.
7,208,345 B2 4/2007 Meyer et al.
7,342,320 B2 3/2008 Hedler et al.
7,557,017 B2 * 7/2009 Yamada et al. ............... 438/462
7,619,901 B2 * 11/2009 Eichelberger et al. ........ 361/763
7,807,508 B2 * 10/2010 Oganesian et al. ........... 438/114
2002/0089043 A1 * 7/2002 Park et al. ..................... 257/668
2003/0006493 A1 * 1/2003 Shimoishizaka et al. ..... 257/686
2004/0033673 A1 * 2/2004 Cobbley et al. ............... 438/455
2004/0235270 A1 * 11/2004 Noma et al. .................. 438/460
2005/0184246 A1 * 8/2005 Danzer et al. ............ 250/370.09
2005/0239922 A1 * 10/2005 Burns et al. ................... 523/400
2006/0008944 A1 * 1/2006 Shizuno ........................ 438/109
2006/0183349 A1 * 8/2006 Farnworth et al. ............ 438/792
2008/0029879 A1 * 2/2008 Tuckerman et al. .......... 257/704
2008/0048299 A1 * 2/2008 Hedler et al. ................. 257/623
2008/0083977 A1 4/2008 Haba et al.

(Continued)

FOREIGN PATENT DOCUMENTS

DE 19840248 * 3/2000 .............. H01L 23/50

*Primary Examiner* — Fernando L Toledo
*Assistant Examiner* — Victoria K Hall
(74) *Attorney, Agent, or Firm* — Roberts D. Atkins; Patent Law Group: Atkins and Associates, P.C.

(57) ABSTRACT

A semiconductor device has a first semiconductor die with a sloped side surface. The first semiconductor die is mounted to a temporary carrier. An RDL extends from a back surface of the first semiconductor die along the sloped side surface of the first semiconductor die to the carrier. An encapsulant is deposited over the carrier and a portion of the RDL along the sloped side surface. The back surface of the first semiconductor die and a portion of the RDL is devoid of the encapsulant. The temporary carrier is removed. An interconnect structure is formed over the encapsulant and exposed active surface of the first semiconductor die. The RDL is electrically connected to the interconnect structure. A second semiconductor die is mounted over the back surface of the first semiconductor die. The second semiconductor die has bumps electrically connected to the RDL.

26 Claims, 10 Drawing Sheets

(56) References Cited

U.S. PATENT DOCUMENTS

| | | | | |
|---|---|---|---|---|
| 2008/0116545 | A1 | 5/2008 | Grinman et al. | |
| 2008/0136046 | A1 * | 6/2008 | Hashimoto | 257/783 |
| 2008/0283971 | A1 * | 11/2008 | Huang et al. | 257/620 |
| 2009/0065902 | A1 * | 3/2009 | Yu et al. | 257/620 |
| 2009/0243069 | A1 * | 10/2009 | Camacho et al. | 257/686 |
| 2009/0283870 | A1 * | 11/2009 | Pagaila et al. | 257/620 |
| 2009/0283881 | A1 * | 11/2009 | Wang et al. | 257/676 |
| 2009/0316378 | A1 * | 12/2009 | Haba et al. | 361/808 |
| 2010/0140813 | A1 | 6/2010 | Pagaila et al. | |
| 2010/0173454 | A1 * | 7/2010 | Chong et al. | 438/109 |
| 2010/0230795 | A1 * | 9/2010 | Kriman et al. | 257/686 |

* cited by examiner

SEMICONDUCTOR DEVICE AND METHOD OF FORMING RDL ALONG SLOPED SIDE SURFACE OF SEMICONDUCTOR DIE FOR Z-DIRECTION INTERCONNECT

FIELD OF THE INVENTION

The present invention relates in general to semiconductor devices and, more particularly, to a semiconductor device and method of forming a redistribution layer along a sloped side surface of a semiconductor die for z-direction electrical interconnect.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

In a fan-out wafer level chip scale package (FO-WLCSP), the vertical (z-direction) electrical interconnect can be accomplished with conductive through silicon vias (TSV), through hole vias (THV), through mold vias (TMV), or Cu-plated conductive pillars. Vias are formed in silicon or organic material around the die using mechanical drilling, laser drilling, or deep reactive ion etching (DRIE). The vias are filled with conductive material, for example by copper deposition using an electroplating process, to form the conductive TSVs, THVs, and TMVs. The TSVs, THVs, and TMVs further connect through a build-up interconnect structure which is formed across the semiconductor die.

Conventional TSVs, THVs, and TMVs are relatively time consuming and costly to form. The TSVs, THVs, and TMVs tend to have a high aspect ratio, which limits the interconnect pitch and reduces input/output (I/O) density. The TSVs, THVs, and TMVs are subject to voids, which causes defects. The Cu-plated conductive pillars require masking and photolithography which adds time and cost to the manufacturing process. In addition, FO-WLCSP are subject to vertical and lateral die shifting during encapsulation.

SUMMARY OF THE INVENTION

A need exists to form a low-cost z-direction electrical interconnect with a fine pitch and high I/O density for FO-WLCSPs. Accordingly, in one embodiment, the present invention is a method of making a semiconductor device comprising the steps of providing a plurality of first semiconductor die each having a sloped side surface, providing a temporary carrier, mounting an active surface of the first semiconductor die to the temporary carrier, forming a first RDL extending from a back surface of the first semiconductor die along the sloped side surface of the first semiconductor die to the temporary carrier, depositing an encapsulant over the temporary carrier and a portion of the first RDL along the sloped side surface of the first semiconductor die, removing the temporary carrier to expose the active surface of the first semiconductor die, and forming an interconnect structure over the encapsulant and exposed active surface of the first semiconductor die. The first RDL is electrically connected to the interconnect structure.

In another embodiment, the present invention is a method of making a semiconductor device comprising the steps of providing a plurality of first semiconductor die each having a sloped side surface, providing a carrier, mounting a first surface of the first semiconductor die to the carrier, forming an RDL extending from a second surface of the first semiconductor die along the sloped side surface to the carrier, depositing a first encapsulant over the carrier and RDL, removing the carrier to expose the first surface of the first semiconductor die, and forming an interconnect structure over the first encapsulant and exposed first surface of the first semiconductor die. The RDL is electrically connected to the interconnect structure.

In another embodiment, the present invention is a method of making a semiconductor device comprising the steps of providing a first semiconductor die having a sloped side surface, providing a carrier, mounting the first semiconductor die to the carrier, forming an RDL, including an insulating layer and conductive layer, extending from a surface of the first semiconductor die along the sloped side surface to the carrier, depositing an encapsulant over the carrier and RDL, removing the carrier, and forming an interconnect structure over the encapsulant and first semiconductor die. The RDL is electrically connected to the interconnect structure.

In another embodiment, the present invention is a semiconductor wafer comprising a carrier and first semiconductor die having a sloped side surface mounted to the carrier. An RDL extends from a surface of the first semiconductor die along the sloped side surface to the carrier. A first encapsulant is deposited over the carrier and RDL. The carrier is removed. An interconnect structure is formed over the first encapsulant and first semiconductor die. The RDL is electrically connected to the interconnect structure.

DETAILED DESCRIPTION OF THE DRAWINGS

Figure 1:
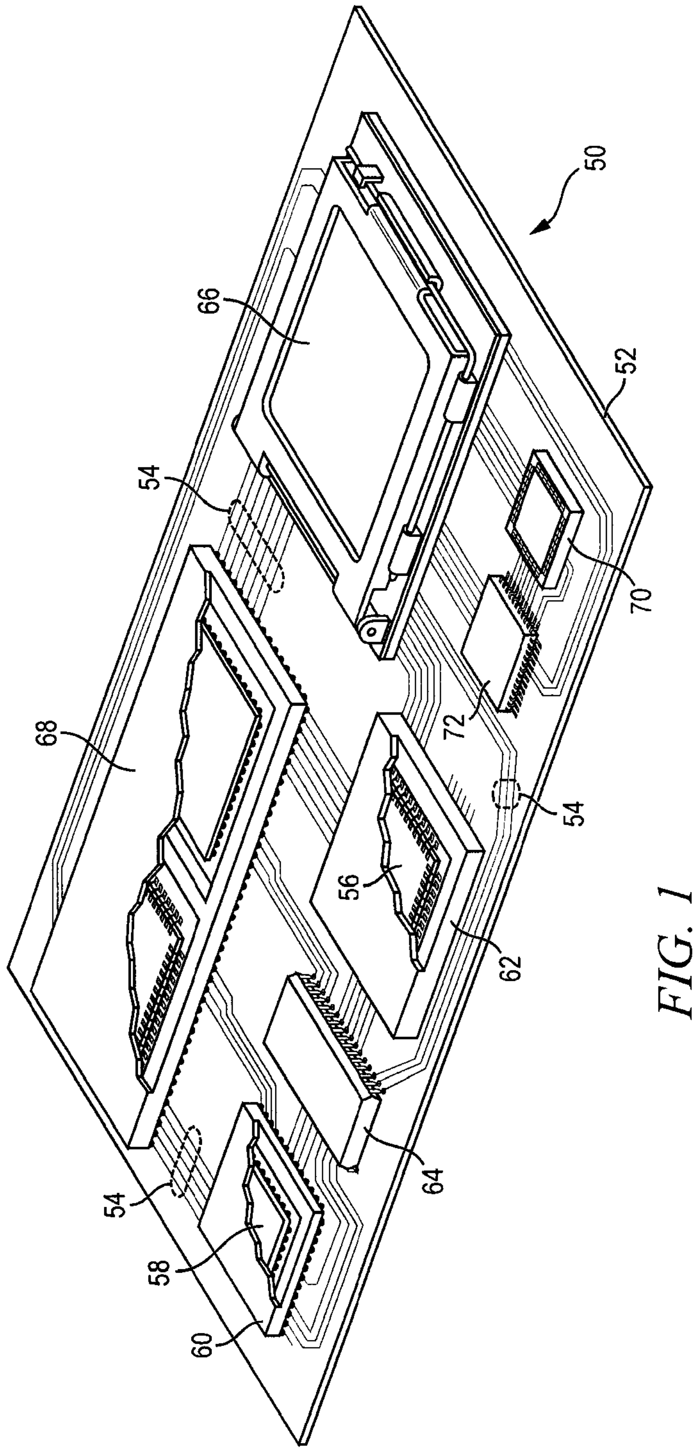
FIG. 1 illustrates a PCB with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes.

The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a subcomponent of a larger system. For example, electronic device 50 may be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. The miniaturization and the weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
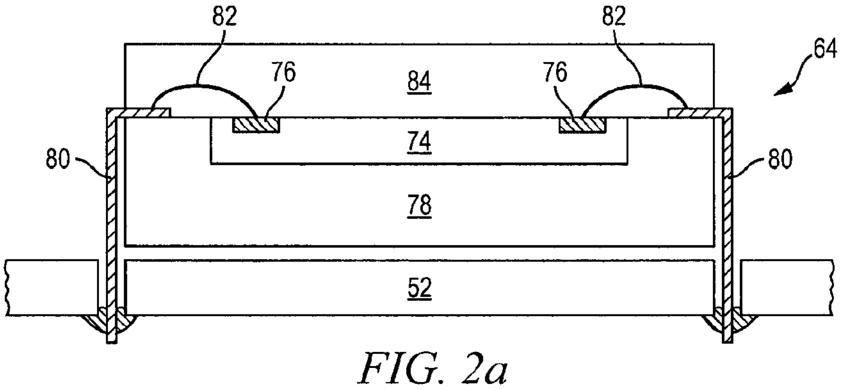
FIGS. 2_a_-2_c_ illustrate further detail of the representative semiconductor packages mounted to the PCB.
Figure 2B:
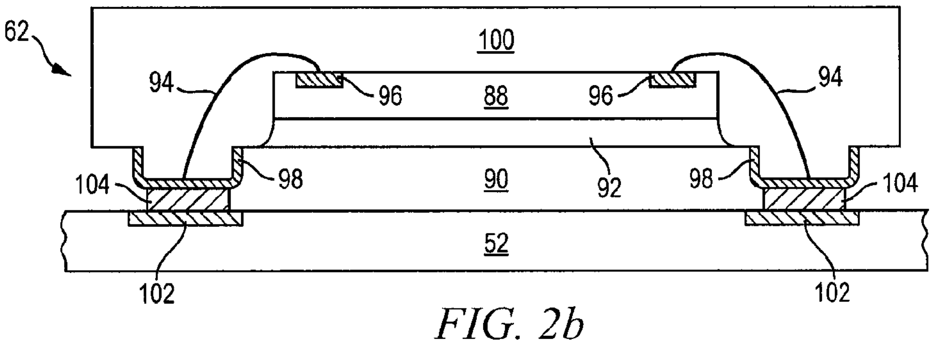
Figure 2C:
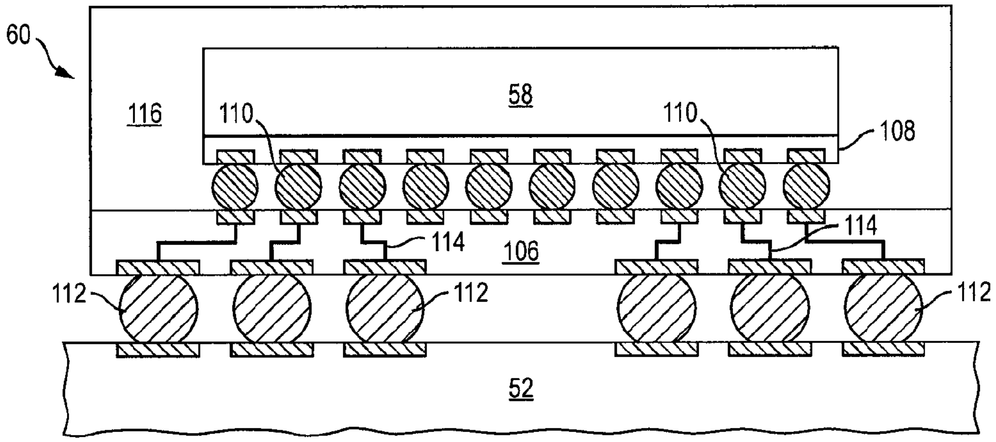

FIGS. 2*a*-2*c* show exemplary semiconductor packages. FIG. 2*a* illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 2*b* illustrates further detail of BCC 62 mounted on PCB 52. Semiconductor die 88 is mounted over carrier 90 using an underfill or epoxy-resin adhesive material 92. Wire bonds 94 provide first level packaging interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2*c*, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3A:
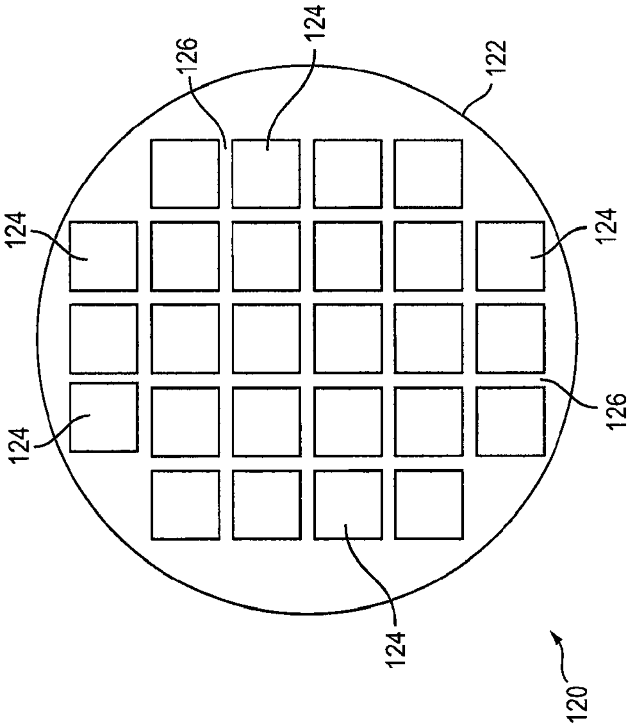
FIGS. 3_a_-3_c_ illustrate a semiconductor wafer containing a plurality of semiconductor die.

FIG. 3*a* shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by saw streets 126 as described above.

Figure 3B:
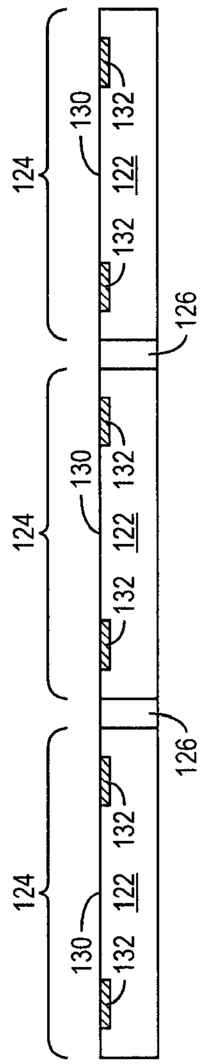

FIG. 3*b* shows a cross-sectional view of a portion of semiconductor wafer 120. Each semiconductor die 124 has an active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain IPDs, such as inductors, capacitors, and resistors, for RF signal processing. In one embodiment, semiconductor die 124 is a flipchip type semiconductor die.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130.

Figure 3C:
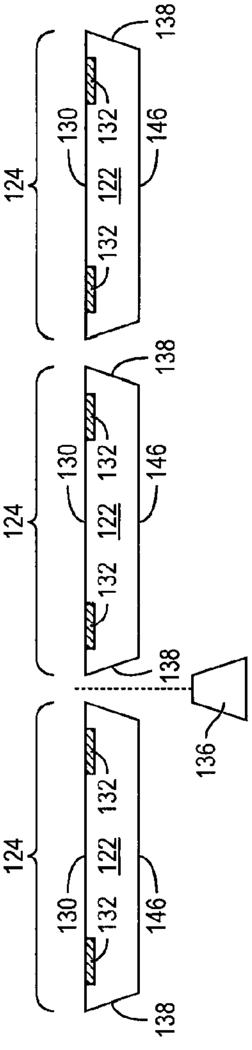

In FIG. 3*c*, semiconductor wafer 120 is singulated through saw street 126 using a beveled or angled saw blade or laser cutting tool 136 into individual semiconductor die 124. The cutting tool 136 cuts an angled or sloped side surface 138 into base material 122. A tetramethylammonium hydroxide (TMAH) or potassium hydroxide (KOH) process can be used during singulation. The angled or sloped side surface 138 of the semiconductor die 124 extends inwardly from active surface 130 to back surface 146 so that the back surface has a smaller area than the active surface.

Figure 4A:
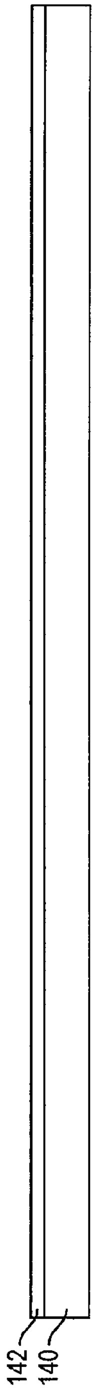
FIGS. 4_a_-4_j_ illustrate a process of forming an RDL along a sloped side surface of a semiconductor die for z-direction electrical interconnect.

FIGS. 4*a*-4*j* illustrate, in relation to FIGS. 1 and 2*a*-2*c*, a process of forming an RDL along a sloped side surface of a semiconductor die for a z-direction electrical interconnect. In FIG. 4*a*, a temporary carrier or substrate 140 contains sacrificial base material such as silicon, polymer, polymer composite, metal, ceramic, glass, glass epoxy, beryllium oxide, or other suitable low-cost, rigid material or bulk semiconductor material for structural support. An optional interface layer or double-sided tape 142 can be formed over carrier 140 as a temporary adhesive bonding film or etch-stop layer.

Figure 4B:
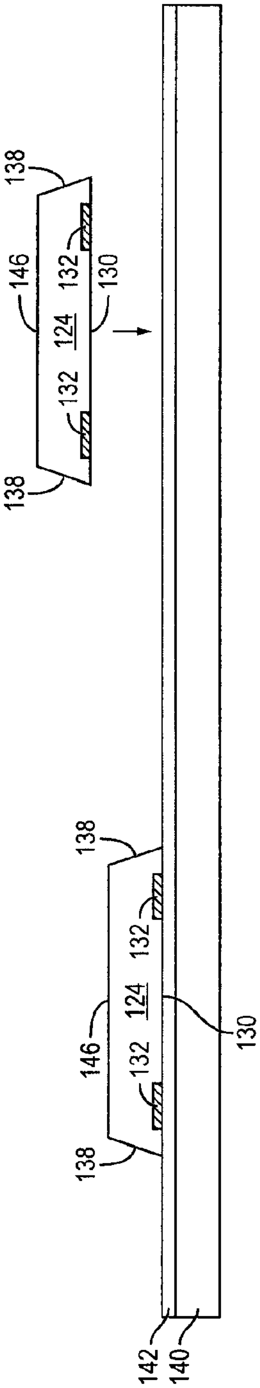
Figure 4C:
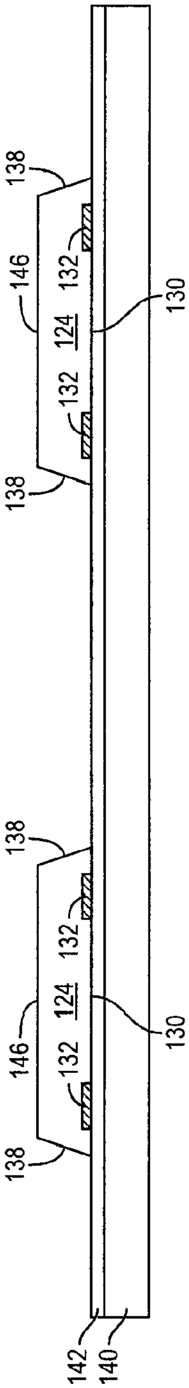

In FIG. 4*b*, each semiconductor die 124 is mounted with active surface 130 oriented to interface layer 142 over carrier 140 using a pick and place operation. FIG. 4*c* shows all semiconductor die 124 mounted to carrier 140 with the larger area active surface 130 contacting interface layer 142 and the angled or sloped side surface 138 extending from the active surface 130 to the smaller area back surface 146.

Figure 4D:
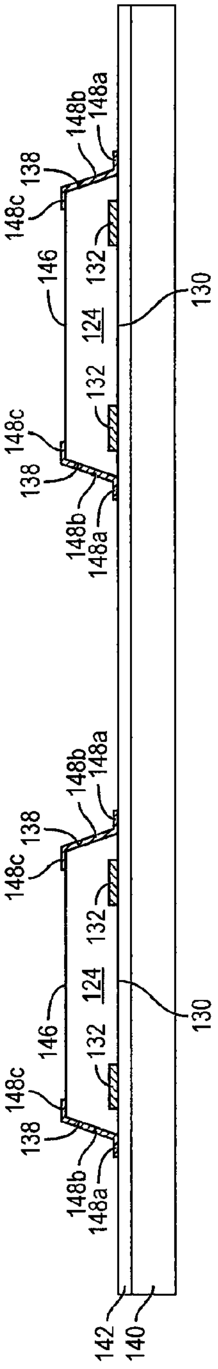
Figure 4E:
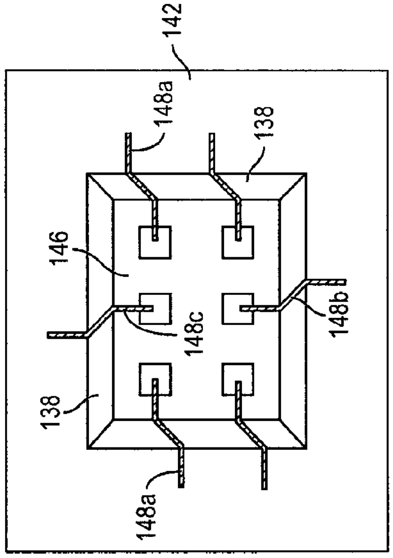

In FIG. 4*d*, an electrically conductive layer or redistribution layer (RDL) 148 is formed over interface layer 142, side surface 138 of semiconductor die 124, and back surface 146 using a patterning and metal deposition process such as printing, PVD, CVD, sputtering, electrolytic plating, and electroless plating. Conductive layer 148 can be one or more layers of Al, Cu, Sn, Ni, Au, Ag, or other suitable electrically conductive material. RDL 148 is formed from back surface 146 down sloped side surface 138 to predetermined locations on interface layer 142, with RDL 148*a* disposed over interface layer 142, RDL 148*b* disposed over sloped side surface 138 of semiconductor die 124, and RDL 148*c* disposed over back surface 146. FIG. 4*e* shows a top view of semiconductor die 124 and RDL 148 extending from the smaller area back surface 146 down sloped side surface 138 to interface layer 142.

Figure 4F:
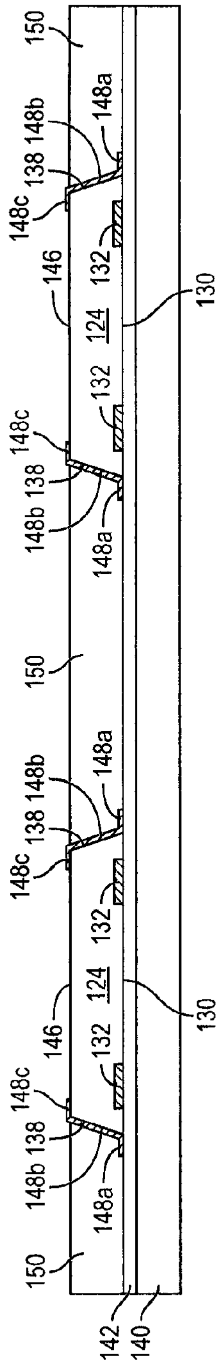

In FIG. 4*f*, an encapsulant or molding compound 150 is deposited over carrier 140, semiconductor die 124, and RDL 148 using a paste printing, compressive molding, transfer molding, liquid encapsulant molding, vacuum lamination, spin coating, or other suitable applicator. In one embodiment, encapsulant 150 is deposited using film-assisted molding process. Encapsulant 150 can be polymer composite material, such as epoxy resin with filler, epoxy acrylate with filler, or polymer with proper filler. Encapsulant 150 is non-conductive and environmentally protects the semiconductor device from external elements and contaminants. Encapsulant 150 is removed from back surface 146 of semiconductor die 124 and RDL 148*c* using an etching, mechanical grinding, or cleaning process. Alternatively, the deposition of encapsulant 150 is controlled in the proper amount to form the encapsulant over carrier 140 and RDL 148*a*-148*b* so that back surface 146 of semiconductor die 124 and RDL 148*c* remain devoid of the encapsulant for interconnect to other devices. In either case, back surface 146 and RDL 148*c* are exposed after encapsulation.

The combination of RDL 148 and sloped side surface 138 maintains a strong adhesion between semiconductor die 124 and interface layer 142 to reduce vertical and lateral die shifting during encapsulation. The sloped side surface 138 reduces shear stress around the edges of semiconductor die 124. To further reduce die shifting, carrier 140 can be a rigid copper plate, or interface layer 142 can be implemented with a high temperature double-side tape to withstand temperatures up to 200° C.

Figures 4G, 4H, 4I:
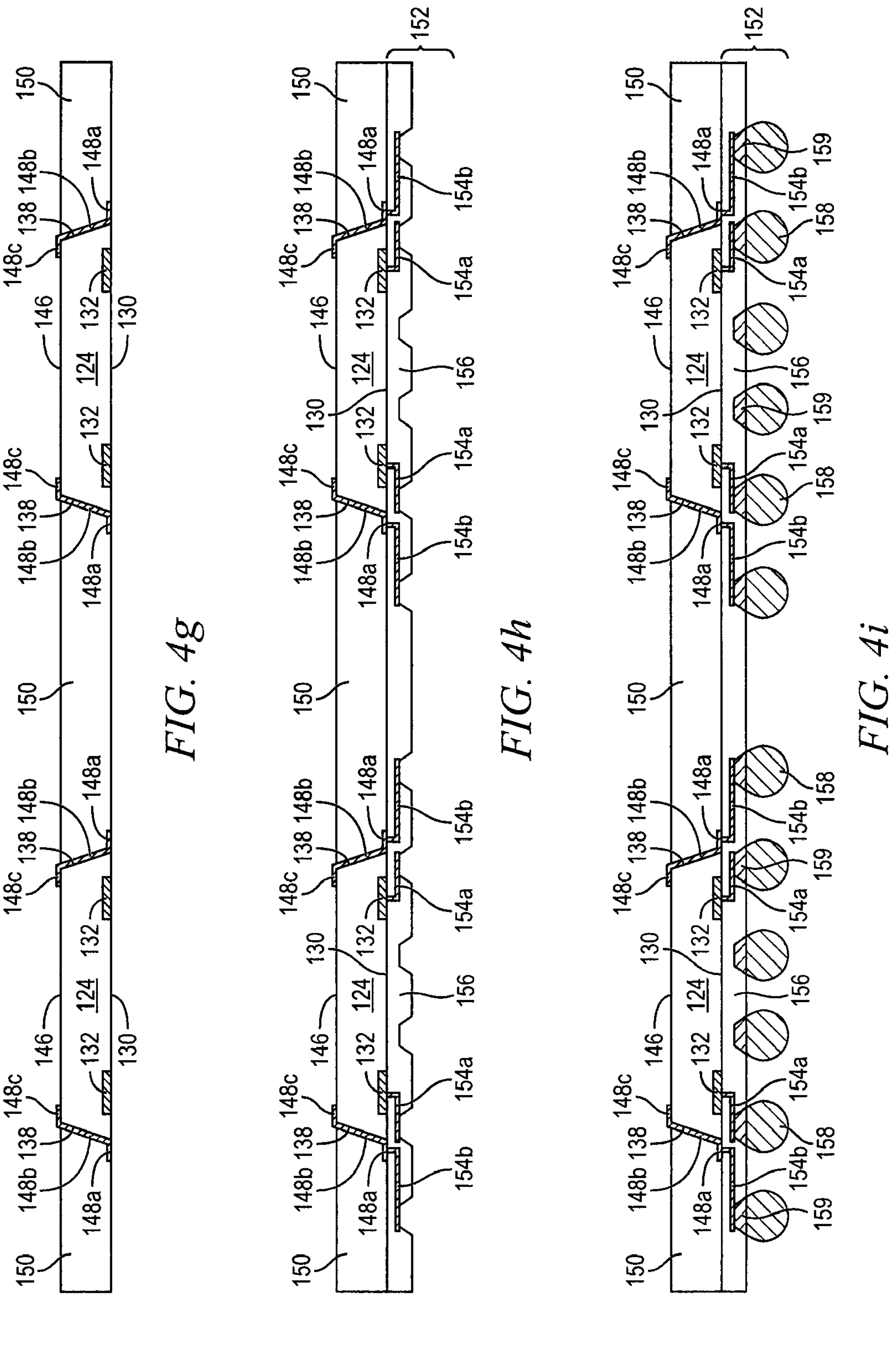

In FIG. 4*g*, temporary carrier 140 and interface layer 142 are removed by chemical etching, mechanical peel-off, CMP, mechanical grinding, thermal bake, UV light, laser scanning, or wet stripping to expose active surface 130 and contact pads 132 and encapsulant 150.

In FIG. 4*h*, a build-up interconnect structure 152 is formed over the exposed active surface 130 of semiconductor die, RDL 148*a*, and encapsulant 150. The build-up interconnect structure 152 includes an electrically conductive layer or RDL 154 formed using a patterning and metal deposition process such as sputtering, electrolytic plating, and electroless plating. RDL 154 can be one or more layers of Al, Cu, Sn, Ni, Au, Ag, or other suitable electrically conductive material. RDL 154*a* is electrically connected to contact pads 132, and RDL 154*b* is electrically connected to RDL 148*a*. Other portions of RDL 154 can be electrically common or electrically isolated depending on the design and function of semiconductor die 124.

The build-up interconnect structure 152 further includes an insulating or passivation layer 156 formed between conductive layers 154 for electrical isolation. The insulating layer 156 contains one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. The insulating layer 156 is formed using PVD, CVD, printing, spin coating, spray coating, sintering or thermal oxidation. A portion of insulating layer 156 is removed by an etching process to expose conductive layer 154*a* and 154*b* for bump formation or additional package interconnect.

In FIG. 4*i*, an electrically conductive bump material is deposited over build-up interconnect structure 152 and electrically connected to conductive layer 154 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 154 using a suitable attachment or bonding process. In one embodiment, the bump material is reflowed by heating the material above its melting point to form spherical balls or bumps 158. In some applications, bumps 158 are reflowed a second time to improve electrical contact to conductive layer 154. An under bump metallization (UBM) 159 can be formed under bumps 158. The bumps can also be compression bonded to conductive layer 154. Bumps 158 represent one type of interconnect structure that can be formed over conductive layer 154. The interconnect structure can also use bond wires, stud bump, micro bump, or other electrical interconnect.

Figure 4J:
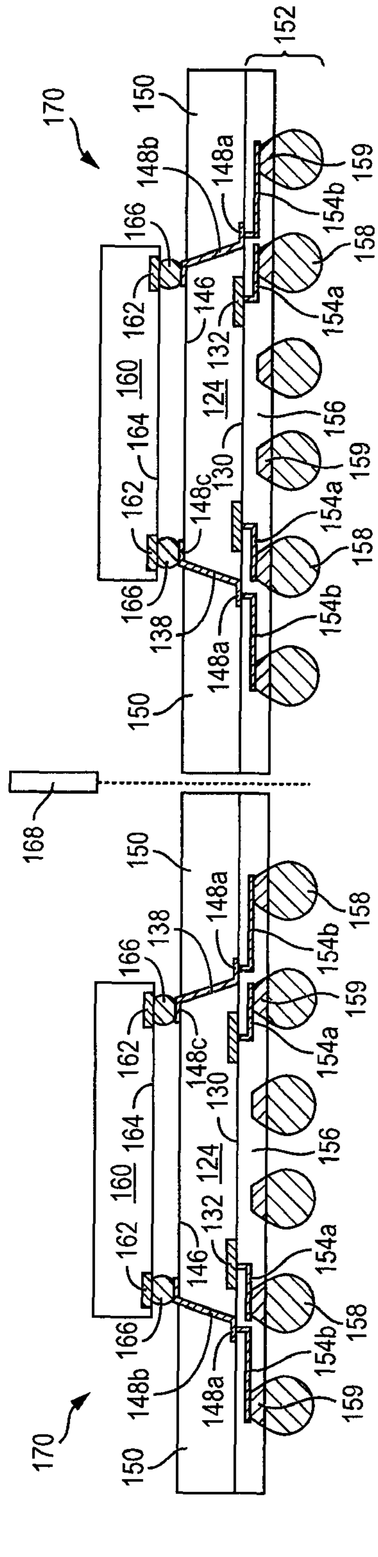

FIG. 4*j* shows semiconductor die 160 having contact pads 162 formed on active surface 164 which contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 164 to implement analog circuits or digital circuits, such as DSP, ASIC, memory, or other signal processing circuit. Semiconductor die 160 may also contain IPDs, such as inductors, capacitors, and resistors, for RF signal processing. Contact pads 162 are electrically connected to the circuits on active surface 164. A plurality of bumps 166 is formed over contact pads 162. Semiconductor die 160 are mounted to RDL 148*c* using bumps 166.

The encapsulant 150 and interconnect structure 152 are singulated using saw blade or laser cutting tool 168 into individual FO-WLCSP 170. Alternatively, semiconductor die 160 can be mounted to semiconductor die 124 after singulation.

Figure 5:
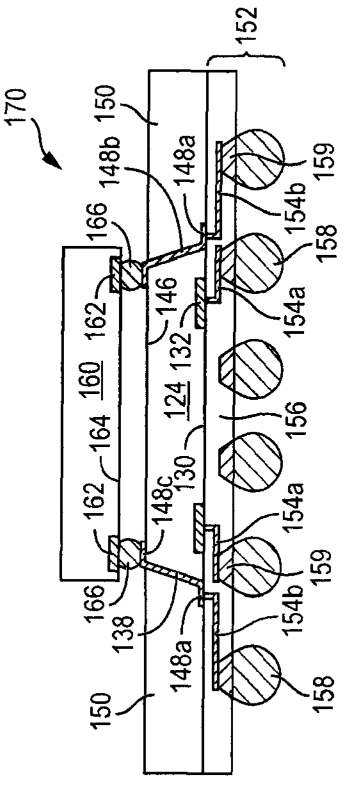
FIG. 5 illustrates a FO-WLCSP with the RDL formed along a sloped side surface of a semiconductor die for a z-direction electrical interconnect.

FIG. 5 shows FO-WLCSP 170 after singulation. Semiconductor die 124 is electrically connected through interconnect structure 152 to RDL 148 and bumps 158. Semiconductor die 160 can be mounted to semiconductor die 124 and electrically connected through RDL 148. Accordingly, RDL 148 provides a z-direction electrical interconnect without forming conductive vias through semiconductor die 124 or encapsulant 150, as described in the background. RDL 148 avoids the problem of void formation common with prior art conductive vias. RDL 148 is formed without costly masking and photolithography, which are needed for conductive vias. Since no conductive vias are formed through encapsulant 150, i.e., RDL 148 occupies no encapsulant area, additional components can be mounted over all areas of encapsulant 150 to reduce package size and enhance functionality. RDL 148 provides a fine z-direction interconnect pitch, high I/O density, and efficient metal deposition. RDL 148 reduces cost by using less material for the encapsulant and interconnect structure. The combination of RDL 148 and sloped side surface 138 maintains a strong adhesion between semiconductor die 124 and interface layer 142 to reduce vertical and lateral die shifting during encapsulation. The sloped side surface 138 reduces shear stress around the edges of semiconductor die 124.

Figure 6:
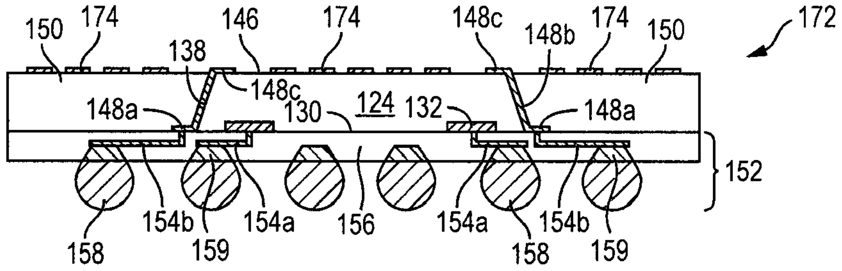
FIG. 6 illustrates the RDL formed over the encapsulant and back surface of the semiconductor die.

FIG. 6 shows an embodiment of FO-WLCSP 172, similar to FIG. 5, with conductive layer or RDL 174 formed over back surface 146 of semiconductor die 124 and encapsulant 150. RDL 174 is electrically connected to RDL 148*c*.

Figure 7:
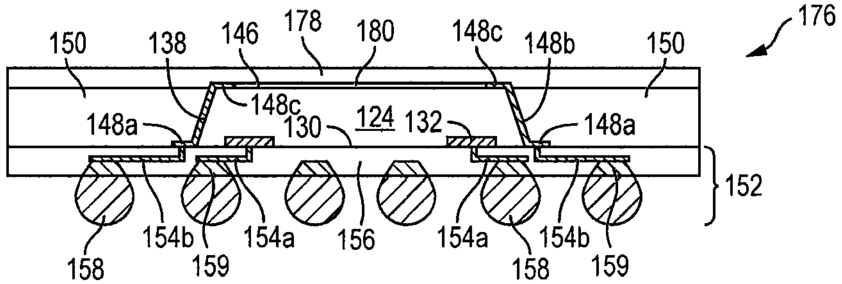
FIG. 7 illustrates an EMI and RFI shielding layer formed over the encapsulant and back surface of the semiconductor die.

FIG. 7 shows an embodiment of FO-WLCSP 176, similar to FIG. 5, with shielding layer 178 formed over back surface 146 of semiconductor die 124 and encapsulant 150. Shielding layer 178 can be Al, ferrite or carbonyl iron, stainless steel, nickel silver, low-carbon steel, silicon-iron steel, foil, conductive resin, and other metals and composites capable of blocking or absorbing electromagnetic interference (EMI), radio frequency interference (RFI), harmonic distortion, and other inter-device interference. Shielding layer 178 is patterned and conformally deposited using an electrolytic plating, electroless plating, sputtering, PVD, CVD, or other suitable metal deposition process. Shielding layer 178 can also be a non-metal material such as carbon-black or aluminum flake to reduce the effects of EMI and RFI. For non-metal materials, shielding layer 178 can be applied by lamination, spraying, or painting. An interposing insulating layer 180 is disposed between shielding layer 178 and semiconductor die 124. Shielding layer 178 is electrically connected through RDL 148 and interconnect structure 152 to an external low-impedance ground point.

Figure 8:
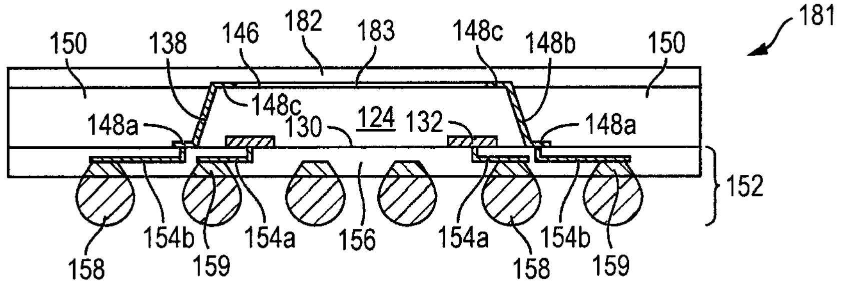
FIG. 8 illustrates a heat sink formed over the encapsulant and back surface of the semiconductor die.

FIG. 8 shows an embodiment of FO-WLCSP 181, similar to FIG. 5, with heat sink 182 formed over back surface 146 of semiconductor die 124 and encapsulant 150. Heat sink 182 can be Cu, Al, or other material with high thermal conductivity. A thermal interface material (TIM) 183 can be disposed between heat sink 182 and back surface 146 of semiconductor die 124 to aid with distribution and dissipation of heat generated by the semiconductor die. TIM 183 can be aluminum oxide, zinc oxide, boron nitride, or pulverized silver.

Figure 9:
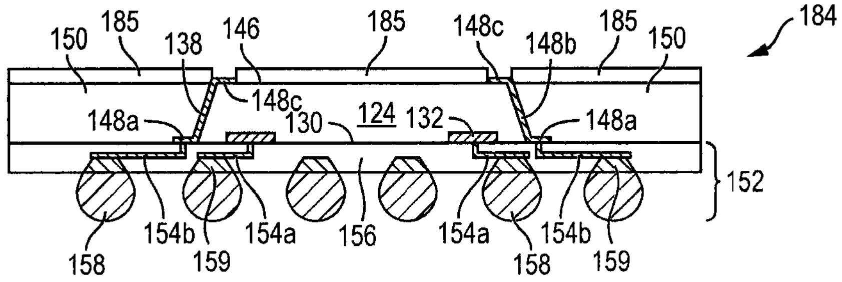
FIG. 9 illustrates a solder resist layer formed over the encapsulant and back surface of the semiconductor die.

FIG. 9 shows an embodiment of FO-WLCSP 184, similar to FIG. 5, with solder resist layer 185 deposited over back surface 146 of semiconductor die 124 and encapsulant 150. A portion of solder resist layer 185 is removed by an etching process to expose RDL 148*c*.

Figure 10:
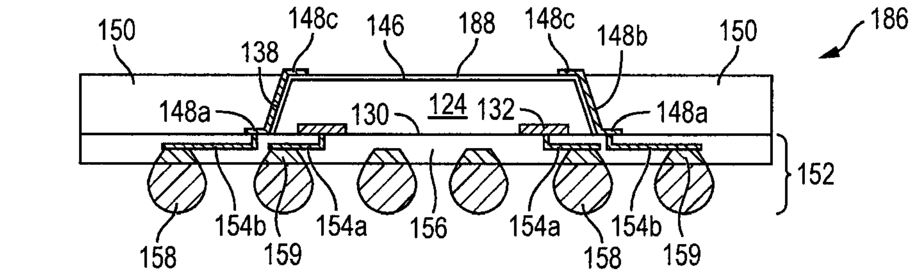
FIG. 10 illustrates an insulating layer formed between the RDL and side surface of the semiconductor die.

FIG. 10 shows an embodiment of FO-WLCSP 186, similar to FIG. 5, with insulating layer 188 formed over semiconductor die prior to forming RDL 148, i.e., during the process step of FIG. 4*c*. RDL 148 is formed over insulating layer 188, similar to FIGS. 4*d* and 4*e*, and the remaining processing steps of FIGS. 4*d*-4*j* are performed to realize FO-WLCSP 186.

Figure 11:
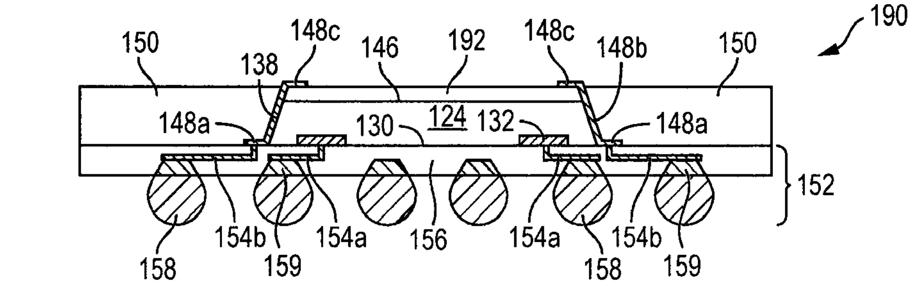
FIG. 11 illustrates a protective layer formed over the back surface of the semiconductor die.

FIG. 11 shows an embodiment of FO-WLCSP 190, similar to FIG. 5, with protective layer 192 formed over back surface 146 of semiconductor die 124 prior to forming RDL 148, i.e., during the process step of FIG. 4*c*. RDL 148 is formed over sides 138 of semiconductor die 124 and protective layer 192, similar to FIGS. 4*d* and 4*e*, and the remaining processing steps of FIGS. 4*d*-4*j* are performed to realize FO-WLCSP 190.

Figure 12A:
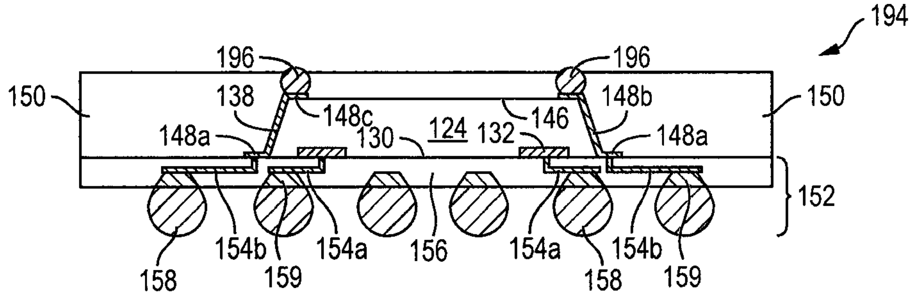
FIGS. 12_a_-12_b_ illustrate a conductive via and upper semiconductor die formed over the back surface of the lower semiconductor die.
Figure 12B:
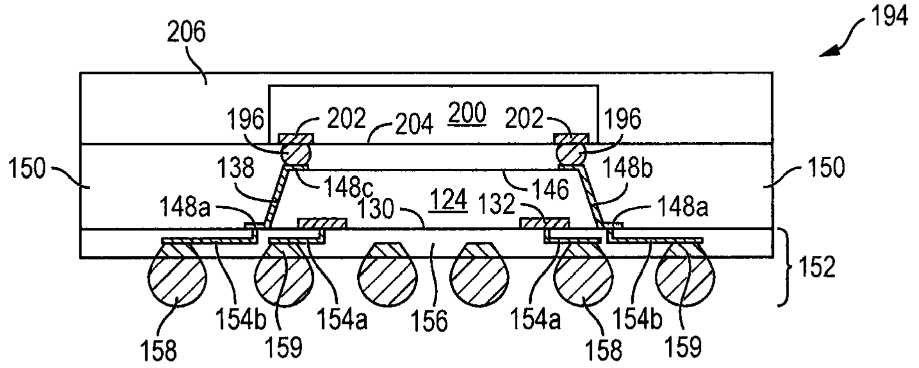

FIGS. 12*a*-12*b* show an embodiment of FO-WLCSP 194 with bumps or pillars 196 formed over RDL 148*c* prior to depositing encapsulant 150.

In another embodiment, encapsulant 150 is deposited over back surface 146 of semiconductor die 124, i.e., during the process step of FIG. 4*f*. However, instead of removing encapsulant 150 from back surface 146 as described in FIG. 4*f*, a plurality of vias is formed through encapsulant 150 over RDL 148*c* using mechanical drilling, laser drilling, or deep reactive ion etching (DRIE). The vias are filled with Al, Cu, Sn, Ni, Au, Ag, Ti, tungsten (W), poly-silicon, or other suitable electrically conductive material using electrolytic plating, electroless plating process, or other suitable metal deposition process to form z-direction conductive pillars or vias 196.

Alternatively, a plurality of stud bumps or solder balls can be formed within the vias. The remaining processing steps of FIGS. 4*f*-4*j* are performed to realize FO-WLCSP 194.

Conductive pillars or bumps 196 extend the z-direction electrical interconnect of RDL 148 for semiconductor components mounted to semiconductor die 124. For example, in FIG. 12*b*, semiconductor die 200 has contact pads 202 formed on active surface 204 which contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 204 to implement analog circuits or digital circuits, such as DSP, ASIC, memory, or other signal processing circuit. Semiconductor die 200 may also contain IPDs, such as inductors, capacitors, and resistors, for RF signal processing. Contact pads 202 are electrically connected to the circuits on active surface 204. Semiconductor die 200 is mounted to semiconductor die 124 with contact pads 202 electrically connected to conductive vias 196.

A second encapsulant or molding compound 206 is deposited over semiconductor die 200 and encapsulant 150 using a paste printing, compressive molding, transfer molding, liquid encapsulant molding, vacuum lamination, spin coating, or other suitable applicator. Encapsulant 206 can be polymer composite material, such as epoxy resin with filler, epoxy acrylate with filler, or polymer with proper filler. Encapsulant 206 is non-conductive and environmentally protects the semiconductor device from external elements and contaminants.

Alternatively, semiconductor die 200 is mounted to semiconductor die 124 with bumps formed on contact pads 202 prior to depositing encapsulant 150, i.e., in the process step of FIG. 4*d*. After mounting semiconductor die 200, encapsulant 150 is deposited over semiconductor die 124 and 200 and the temporary carrier, and the remaining processing steps of FIGS. 4*f*-4*i* are performed to realize FO-WLCSP 194. The encapsulant 150 and interconnect structure 152 are singulated using saw blade or laser cutting tool 168 into individual FO-WLCSP 194.

Figure 13:
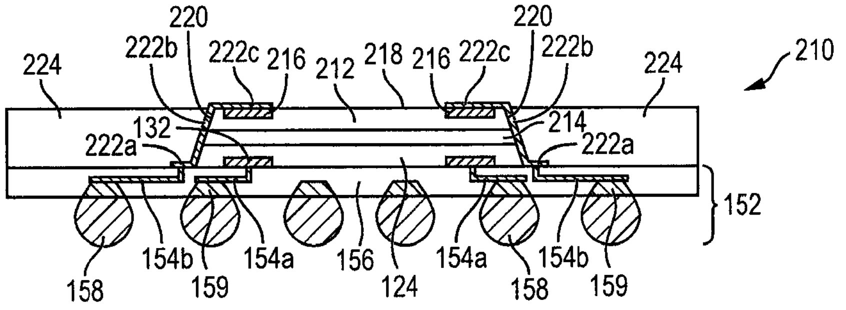
FIG. 13 illustrates the RDL formed along sloped sides of stacked semiconductor die.

FIG. 13 shows an embodiment of FO-WLCSP 210 with semiconductor die 212 mounted back-to-back to semiconductor die 124 with die attach adhesive 214, prior to forming RDL 148, i.e., during the process step of FIG. 4*d*. Semiconductor die 212 has contact pads 216 formed on active surface 218 which contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 218 to implement analog circuits or digital circuits, such as DSP, ASIC, memory, or other signal processing circuit. Semiconductor die 212 may also contain IPDs, such as inductors, capacitors, and resistors, for RF signal processing. Contact pads 216 are electrically connected to the circuits on active surface 218.

Semiconductor die 212 is singulated from a wafer to have a complementary or opposite angled or sloped side surface 220 with respect to sloped side surface 138 of semiconductor die 124. That is, active surface 218 has a smaller area than the back surface of semiconductor die 212. The sloped side surface 220 is aligned with the sloped side surface 138 so that RDL 222 can be formed from active surface 218 down side surface 220 of semiconductor die 212 and side surface 138 of semiconductor die 124 to locations on interface layer 142 with RDL 222*a* disposed over interface layer 142, RDL 222*b* disposed over side surface 138 and side surface 220, and RDL 222*c* disposed over active surface 218. RDL 222*c* is electrically connected to contact pad 216.

An encapsulant or molding compound 224 is deposited over RDL 222 and carrier 140 using a paste printing, compressive molding, transfer molding, liquid encapsulant molding, vacuum lamination, spin coating, or other suitable applicator. Encapsulant 224 can be polymer composite material, such as epoxy resin with filler, epoxy acrylate with filler, or polymer with proper filler. Encapsulant 224 is non-conductive and environmentally protects the semiconductor device from external elements and contaminants. The remaining processing steps of FIGS. 4*g*-4*j* are performed to realize FO-WLCSP 210.

Figure 14:
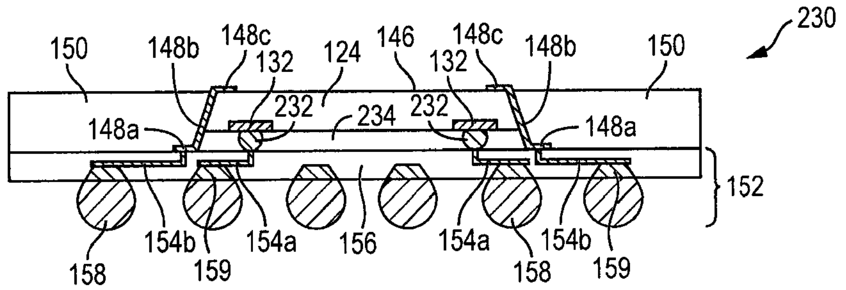
FIG. 14 illustrates the RDL formed over a bumped semiconductor die.

FIG. 14 shows an embodiment of FO-WLCSP 230 with bumps 232 formed on contact pads 132, prior to wafer singulation, i.e., during the process step of FIG. 3*b*. After semiconductor die 124 with bumps 232 are mounted to carrier 140, similar to FIGS. 4*c* and 4*d*, an underfill material 234, such as epoxy resin, is deposited between active surface 130 and interface layer 142. The remaining processing steps of FIGS. 4*d*-4*j* are performed to realize FO-WLCSP 230.

Figure 15:
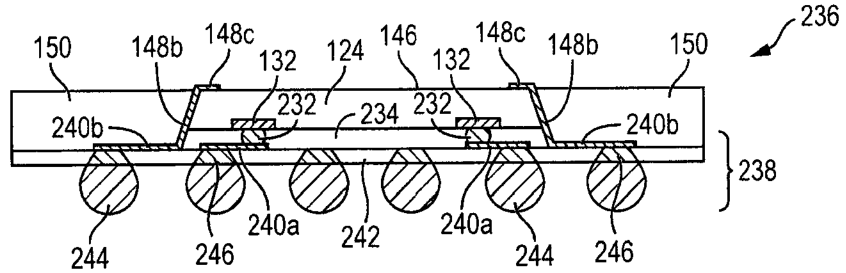
FIG. 15 illustrates a single level interconnect structure formed over the encapsulant and bumped semiconductor die.

FIG. 15 shows an embodiment of FO-WLCSP 236 with a single level interconnect structure 238. In this case, electrically conductive layer or RDL 240 is formed over encapsulant 150 and underfill material 234 using a patterning and metal deposition process such as sputtering, electrolytic plating, and electroless plating. Conductive layer 240 can be one or more layers of Al, Cu, Sn, Ni, Au, Ag, or other suitable electrically conductive material. Conductive layer 240*a* is electrically connected to bumps 232. Conductive layer 240*b* is electrically connected to RDL 148*a*.

An insulating or passivation layer 242 is formed over conductive layer 240 for electrical isolation. The insulating layer 242 can be SiO2, Si3N4, SiON, Ta2O5, Al2O3, or other material having similar insulating and structural properties. In one embodiment, insulating layer 242 is a single solder resist layer. The insulating layer 242 is formed using PVD, CVD, printing, spin coating, spray coating, sintering or thermal oxidation. A portion of insulating layer 242 is removed by an etching process to expose conductive layer 240*a* and 240*b* for bump formation or additional package interconnect.

An electrically conductive bump material is deposited over build-up interconnect structure 238 and electrically connected to conductive layer 240 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 240 using a suitable attachment or bonding process. In one embodiment, the bump material is reflowed by heating the material above its melting point to form spherical balls or bumps 244. In some applications, bumps 244 are reflowed a second time to improve electrical contact to conductive layer 240. A UBM 246 can be formed under bumps 244. The bumps can also be compression bonded to conductive layer 240. Bumps 244 represent one type of interconnect structure that can be formed over conductive layer 240. The interconnect structure can also use bond wires, stud bump, micro bump, or other electrical interconnect.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:

singulating a semiconductor wafer to provide a first semiconductor die including, (a) an active surface, (b) a back surface smaller than and opposite the active surface, and (c) a sloped side surface between the active surface and the back surface;

forming a first redistribution layer (RDL) extending from the back surface of the first semiconductor die, along the sloped side surface of the first semiconductor die, and laterally away from the sloped side surface;

depositing an encapsulant over the sloped side surface and first RDL; and forming an interconnect structure on the active surface of the first semiconductor die, first RDL, and encapsulant with the first RDL being electrically connected to the interconnect structure.

2. The method of claim 1, further including disposing a second semiconductor die over the back surface of the first semiconductor die, the second semiconductor die including a plurality of bumps electrically connected to the first RDL.

3. The method of claim 1, further including forming a second RDL over the back surface of the first semiconductor die.

4. The method of claim 1, further including forming a shielding layer over the back surface of the first semiconductor die.

5. The method of claim 1, further including forming a heat sink over the back surface of the first semiconductor die.

6. The method of claim 1, further including forming a solder resist layer over the back surface of the first semiconductor die.

7. The method of claim 1, further including forming an insulating layer between the first RDL and first semiconductor die.

8. A method of making a semiconductor device, comprising:

singulating a plurality of first semiconductor die each including a sloped side surface and a back surface opposite an active surface;

forming a redistribution layer (RDL) contacting the back surface of the first semiconductor die and extending along the sloped side surface of the first semiconductor die;

depositing a first encapsulant over the sloped side surface and RDL; and forming an interconnect structure over the active surface of the first semiconductor die and the RDL with the RDL being electrically connected to the interconnect structure.

9. The method of claim 8, further including depositing the first encapsulant over the RDL while leaving the back surface of the first semiconductor die and a portion of the RDL devoid of the first encapsulant.

10. The method of claim 8, further including disposing a second semiconductor die over the back surface of the first semiconductor die, the second semiconductor die including a plurality of bumps electrically connected to the RDL.

11. The method of claim 10, further including depositing a second encapsulant over the second semiconductor die.

12. The method of claim 8, further including forming a conductive via electrically connected to the RDL.

13. The method of claim 8, further including forming a protective layer over the back surface of the first semiconductor die.

14. A method of making a semiconductor device, comprising:

providing a first semiconductor die including, (a) an active surface, (b) a back surface smaller than and opposite the active surface, and (c) a sloped side surface between the active surface and the back surface;

disposing the first semiconductor die over a carrier;

forming a redistribution layer (RDL) including an insulating layer and a first conductive layer and extending from the back surface of the first semiconductor die along the sloped side surface of the first semiconductor die to the carrier;

removing the carrier; and forming an interconnect structure over the active surface of the first semiconductor die and RDL with the RDL being electrically connected to the interconnect structure.

15. The method of claim 14, further including depositing an encapsulant over the carrier and RDL with the back surface of the first semiconductor die and a portion of the RDL devoid of the encapsulant.

16. The method of claim 14, further including disposing a second semiconductor die over the back surface of the first semiconductor die, the second semiconductor die including a plurality of bumps electrically connected to the RDL.

17. The method of claim 14, further including forming a plurality of bumps over the active surface of the first semiconductor die prior to disposing the first semiconductor die over the carrier.

18. The method of claim 14, further including depositing an underfill material between the first semiconductor die and carrier.

19. The method of claim 18, wherein forming the interconnect structure includes:

forming a plurality of bumps over the first semiconductor die;

forming a second conductive layer over the underfill material after removing the carrier, the second conductive layer being electrically connected to the bumps and RDL; and forming a solder resist layer over the second conductive layer.

20. A method of making a semiconductor device, comprising:

singulating a semiconductor wafer to provide a first semiconductor die including a sloped side surface;

forming a conductive layer over the sloped side surface and including a segment that is coplanar with an active surface of the first semiconductor die; and forming an interconnect structure over the first semiconductor die and electrically connected to the conductive layer.

21. The method of claim 20, wherein forming the conductive layer over the sloped side surface and including the segment that is coplanar with the active surface of the first semiconductor die further includes:

providing a carrier;

disposing the first semiconductor die over the carrier;

forming the conductive layer extending to the carrier; and removing the carrier before forming the interconnect structure over the first semiconductor die and electrically connected to the conductive layer.

22. The method of claim 21, further including forming a plurality of bumps over the first semiconductor die.

23. The method of claim 20, further including depositing an encapsulant over the first semiconductor die with a back surface of the first semiconductor die and a portion of the conductive layer devoid of the encapsulant.

24. The method of claim 20, further including:

forming the interconnect structure over the active surface of the first semiconductor die and electrically connected to the conductive layer; and disposing a second semiconductor die including a plurality of bumps over a back surface of the first semiconductor die opposite the active surface of the first semiconductor die with the bumps electrically connected to the conductive layer.

25. A method of making a semiconductor device, comprising:

providing a first semiconductor die including a sloped side surface and a back surface opposite an active surface;

disposing a second semiconductor die over the first semiconductor die including a sloped side surface of the second semiconductor die aligned with the sloped side surface of the first semiconductor die;

forming a redistribution layer (RDL) contacting an active surface of the second semiconductor die and extending along the sloped side surfaces of the first and second semiconductor die;

depositing an encapsulant over the sloped side surfaces of the first and second semiconductor die and the RDL; and forming an interconnect structure over the active surface of the first semiconductor die and the RDL with the RDL being electrically connected to the interconnect structure.

26. The method of claim 25, further including depositing the encapsulant over the RDL while leaving the active surface of the second semiconductor die and a portion of the RDL devoid of the encapsulant.

* * * * *